United States Patent [19]

Suzuki et al.

[11] 4,151,610

[45] Apr. 24, 1979

[54] HIGH DENSITY SEMICONDUCTOR MEMORY DEVICE FORMED IN A WELL AND HAVING MORE THAN ONE CAPACITOR

[75] Inventors: Yasoji Suzuki, Ayase; Kiyofumi Ochii, Kawasaki, both of Japan

[73] Assignee: Tokyo Shibaura Electric Co., Ltd., Japan

[21] Appl. No.: 777,664

[22] Filed: Mar. 15, 1977

[30] Foreign Application Priority Data

Mar. 16, 1976 [JP] Japan .................................. 51-28522
Mar. 16, 1976 [JP] Japan .................................. 51-28523

[51] Int. Cl.² ...................... G11C 11/24; G11C 11/40; G11C 7/00
[52] U.S. Cl. .................................... 365/222; 307/238; 357/46; 365/150; 365/178; 365/182
[58] Field of Search ............... 340/173 CA, 173 DR, 340/173 R; 307/279, 238, DIG. 1, 205, 214; 357/42, 46; 365/149, 150, 178, 182, 228, 222

[56] References Cited

U.S. PATENT DOCUMENTS

| | | | |
|---|---|---|---|
| 3,387,286 | 6/1968 | Dennard | 340/173 CA |
| 3,614,753 | 10/1971 | Wahlstrom | 340/173 CA |
| 3,740,731 | 6/1973 | Ohwada et al. | 340/173 CA |
| 3,740,732 | 6/1973 | Frandon | 340/173 CA |
| 3,852,800 | 12/1974 | Ohwada et al. | 307/238 |
| 3,892,984 | 7/1975 | Stein | 340/173 CA |
| 3,893,146 | 7/1975 | Heeren | 365/149 |
| 3,919,569 | 11/1975 | Gaensslen et al. | 307/279 |
| 3,920,481 | 11/1975 | Hu | 357/42 |
| 3,925,685 | 12/1975 | Suzuki | 307/205 |
| 4,021,788 | 5/1977 | Marr | 365/182 |
| 4,044,342 | 8/1977 | Suzuki et al. | 340/173 CA |

OTHER PUBLICATIONS

Fang et al., "Ion Implanted, Bidirectional High Voltage Metal-Oxide-Semiconductor-Field-Effect-Transistor", IBM Tech. Disc. Bull., vol. 15, No. 12, May, 1973, p. 3884.

*Primary Examiner*—Bernard Konick
*Assistant Examiner*—Donald McElheny, Jr.
*Attorney, Agent, or Firm*—Finnegan, Henderson, Farabow & Garrett

[57] ABSTRACT

A semiconductor memory device comprising an N conductivity type semiconductor substrate, a P conductivity type well formed in a specified section of the surface of the semiconductor substrate, N conductivity type source and drain regions formed in the P conductivity type well, and a gate insulation layer deposited on the surface of the well over the source and drain regions. The P conductivity type well has a higher impurity concentration than the N conductivity type semiconductor substrate and the N conductivity type source and drain regions have a higher impurity concentration than the P conductivity type well. An insulation film is formed on the drain region and the insulation film, a metal electrode layer deposited on the insulation film and drain region collectively institute a capacitor.

10 Claims, 6 Drawing Figures

HIGH DENSITY SEMICONDUCTOR MEMORY DEVICE FORMED IN A WELL AND HAVING MORE THAN ONE CAPACITOR

This invention relates to a semiconductor memory device.

The known semiconductor memory devices include a dynamic type using as storing means a parasitic capacitance arising between the node of the constituent circuit and referential voltage point and a static type designed to store data in the fully static form. These conventional semiconductor memory devices are classified into three types, that is, the N channel, P channel and complementary types, according to the kinds of insulated gate field effect transistors (hereinafter abbreviated as "IGFET's") used. The complementary semiconductor memory device is already commercially available as a nonvolatile, static type to draw upon the characteristic of reducing power consumption and, when a driving power source is cut off, is operated by a battery to retain the stored data.

However, the static type semiconductor memory device has the drawback that a memory cell generally requires six IGFET's, increasing the area of a semiconductor chip and in consequence rendering the memory device expensive. Particularly in recent years, the trend has gone toward accepting a semiconductor memory device having a large number of bits. Therefore, the static type semiconductor memory device, which has an unavoidably large chip area and consequently is expensive, is unsuitable for use as a type having an increased storing capacity. Thus, demand has been made for development of a semiconductor memory device requiring fewer IGFET's. To meet this demand, there has been proposed a dynamic type semiconductor memory device provided with a plurality of memory cells each using only one IGFET. An indispensable capacitor for this type of semiconductor memory device is formed by a PN junction region which is formed by diffusion. In this case, diffusion has been carried out over a considerably large area in order to provide a sufficiently large capacitor for the memory cell, resulting in an increase in the chip area.

An object of this invention is to provide a dynamic semiconductor memory device in which source and drain regions are formed in a region having high impurity concentration so that a capacitor having a large capacitance can be formed by diffusion over a small area, thereby permitting a memory cell of a small chip area.

Another object of the invention is to provide a compact semiconductor memory device which comprises a plurality of the above-mentioned memory cells, and refresh circuits for the memory cells.

According to an aspect of this invention, there is provided a semiconductor memory device comprising at least one memory cell including a semiconductor substrate of one conductivity type; a semiconductor region formed in the surface of the semiconductor substrate with the opposite conductivity type to, and at a higher impurity concentration than, the semiconductor substrate; source and drain regions of said one conductivity type formed in the surface of said semiconductor region and having a higher impurity concentration than the semiconductor substrate; a gate insulation layer formed between the source and drain regions; an insulation layer formed partly on one of the source and drain regions; and an electrically conductive layer mounted on said insulation layer, wherein a first capacitor is formed of the conductive layer and said selected one of the source and drain regions constituting mutually facing electrodes and a second capacitor is formed in the junction of said semiconductor region and the selected one of the source and drain regions.

This invention can be more fully understood from the following detailed description when taken in conjunction with the accompanying drawings, in which.

Figure 4:
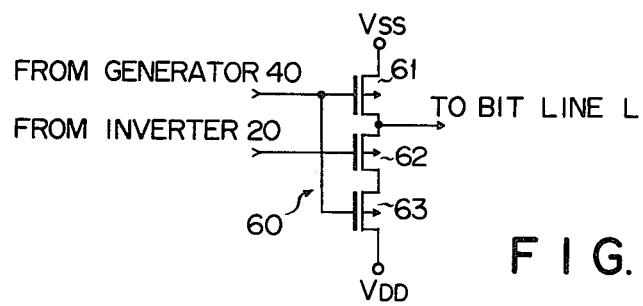
Figure 2:
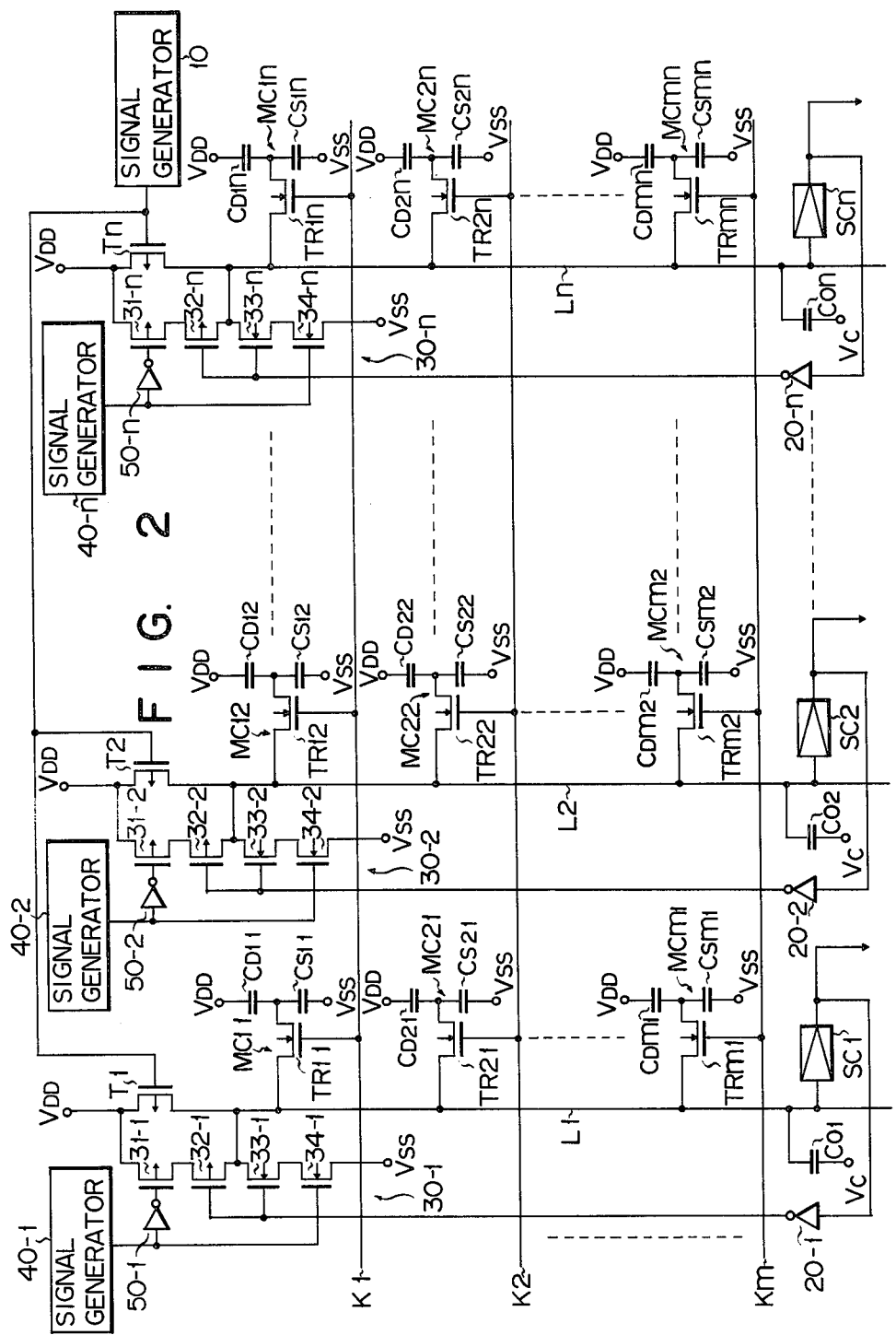
FIG. 2 is a circuit diagram of a semiconductor memory device using the memory cell of FIG. 1.

FIG. 4 indicates a modification of a clocked inverter used with the semiconductor memory circuit of FIG. 2.

There will now be described by reference to the appended drawings a semiconductor memory device according to one embodiment of this invention.

Figure 1:
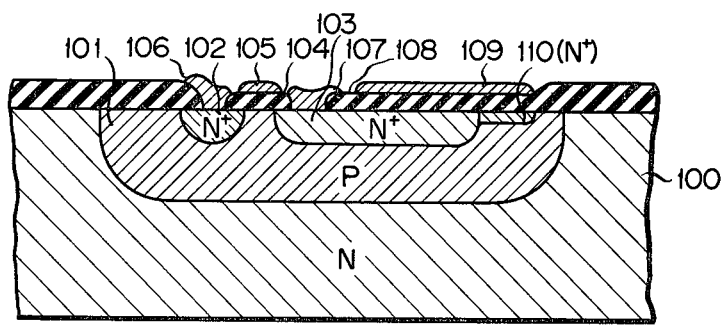
FIG. 1 is a sectional view of a memory cell used with a semiconductor memory according to one embodiment of this invention.

FIG. 1 is a sectional view of a memory cell used with the semiconductor memory device. This memory cell is constructed through the following steps:

First, a P conductivity type well is formed in an N conductivity type silicon substrate 100 by, for example, diffusion or ion implantation. An N+ conductivity type drain region 102 and an N+ conductivity type source region 103 broader than the drain region 102 are formed in the P conductivity type well 101 by diffusion or ion implatation. A gate insulation layer 104 is mounted between the drain region 102 and source region 103. A gate electrode 105 is provided on the gate insulation layer 104. A drain electrode 106 is mounted on the drain region 102 and a source electrode 107 is mounted on the source region 103. What calls for attention in FIG. 1 is that an insulation layer 108 is formed on the broad source region 103, and a metal layer 109 formed of, for example, aluminium or polycrystalline silicon is deposited on the insulation layer 108. The metal layer 109 is connected to a power source $V_{DD}$ (FIG. 2) and a capacitor $C_D$ is formed of the insulation layer 108, the metal layer 109 and source region 103. The metal layer 109 and the source region 103 are used as mutually facing electrodes of the capacitor $C_D$. In a preferred embodiment, an additional N+ conductivity type region 110 is formed in the P conductivity type well 101 in contact with the N+ conductivity type source region 103 in order to increase the capacitance of the capacitor $C_D$ by substantially enlarging the area of the source region 103, that is, the area of the mutually facing electrodes of the capacitor $C_D$. This additional N+ conductivity type region 110 should be formed shallow preferably by ion implantation to prevent a distance between the region 110 and semiconductor substrate 100 from being unduly reduced.

As is apparent from a theory on the physical properties of a semiconductor element, a capacitance of a PN junction is proportional to the square root of that impurity concentration of the one of the diffused layers constituting the PN junction which is lower than that of the other diffused layer. Referring to FIG. 1, the N conductivity type semiconductor substrate 100 is formed at an impurity concentration of $10^{15}$ atoms/cm$^3$ and the P conductivity type well 101 at an impurity concentration of $10^{16}$ atoms/cm$^3$ to cause the impurity concentration of the P-well 101 to be about 10 times higher than that of the semiconductor substrate 100. Where, therefore, the source region 103 is formed in the P conductivity type well 101 having an impurity concentration of $10^{16}$ atoms/cm$^3$, a capacitance $C_S$ of a junction between the source region 103 and P-well 101 is about $\sqrt{10}$ or 3 times higher than a junction capacitance produced in the case where the source region 103 is formed in the semiconductor substrate having an impurity concentration of $10^{15}$ atoms/cm$^3$. Consequently, the present invention results in the formation of a junction capacitor between the P-well 101 and source region 103 with the same capacitance as is obtained in a memory cell used with an ordinary P or N conductivity type memory device but with a reduction in area of diffusion to about one third of that which is required for the ordinary memory device, thereby prominently decreasing the area of a memory cell.

It should be noted that increasing the doping concentration in the P-well will decrease the amount of charge able to be stored in the device. Even though a reduction in the amount of charge able to be stored in the device can be controlled to some extent by the design of the device, applicants have nevertheless found many advantages in forming a memory cell by using a high concentration P-well over memory cells formed in an ordinary P-substrate. For example, the response speed of the memory cell is influenced by the capacitors $C_D$, $C_S$, the junction capacitor $C_O$ formed between drain 102 and the P-well 101, and the stray capacitance $C_1$ formed in other circuit portions. Specifically, applicants have found that an increase in the impurity concentration of the P-well 101 leads to increased capacitances of capacitors $C_S$ and $C_O$. In addition, the increased capacitance of capacitor $C_S$ serves to diminish the influence of stray capacitance $C_1$ on the function of the memory cell, leading to a favorable result that the retention time for data can be prolonged. Data retention time is also increased in a device constructed in accordance with the teachings of the present invention because of resultant reduced leak currents and narrower depletion layers.

The source region 103 in which the above-mentioned capacitors $C_D$, $C_S$ are to be formed should advisably be made broader than the drain region 102 in order to cause the capacitors $C_D$, $C_S$ to have a larger capacitance in the limited chip area.

The memory cell described above can be formed without adding a difficult step, by the same manufacturing technique as the ordinary CMOS manufacturing technique.

FIG. 2 shows a semiconductor memory circuit comprising numerous memory cells arranged in the matrix array of m rows and n columns. Each memory cell comprises an N channel IGFET TR whose gate is connected to a row selection line K and whose drain is connected to a bit line L; a capacitor $C_D$ connected between the source electrode of the IGFET TR and the power source $V_{DD}$; and a capacitor $C_S$ connected between the source electrode of the IGFET TR and the power source $V_{SS}$. The capacitor $C_D$ corresponds to a capacitor formed between the metal layer 109 and source region 103 shown in FIG. 1. The capacitor $C_S$ corresponds to a junction capacitor formed between the source region 103 and P conductivity type well 101.

Figure 3A:
FIGS. 3A, 3B and 3C show the waveforms of signals by way of illustrating the operation of the semiconductor memory circuit of FIG. 2.
Figure 3B:

The one side ends of the bit lines $L_1$ and $L_n$ are connected to P channel IGFET's $T_1$ to $T_n$ whose source electrodes are respectively connected to the power source $V_{DD}$. The gates of the P channel IGFET's $T_1$ to $T_n$ are jointly connected to a timing signal generator 10 for producing a signal having such a waveform as is shown in FIG. 3B. Capacitors $C_{01}$ to $C_{0n}$ are connected between the other side ends of the bit lines $L_1$ to $L_n$ and power source $V_C$. The other side ends of the bit lines $L_1$ to $L_n$ are connected, as is well known, to a data-processing unit (not shown), and also to an output circuit (not shown) through the data-sensing circuits $SC_1$ to $SC_n$. The output terminals of the data-sensing circuits $SC_1$ to $SC_n$ are connected to clocked inverters 30-1 to 30-n through inverters 20-1 to 20-n.

Figure 3C:

The clocked inverter 30 is formed of P channel IGFET's 31, 32 and N channel IGFET's 33, 34 connected in series between the power sources $V_{DD}$ and $V_{SS}$. The gates of the IGFET's 32, 33 are connected to the output terminal of the inverter 20. The junction of said IGFET's 32, 33 is connected to the bit line L. The gate of the P channel IGFET 31 is connected through an inverter 50 to the output terminal of a refresh signal generator 40 for sending forth a refresh signal having such a waveform as is shown in FIG. 3C. The gate of the N channel IGFET 34 is connected to the output terminal of the refresh signal generator 40.

There will now be described the operation of the memory circuit of FIG. 2. Data is written in the memory cell MC by selectively energizing the bit line L and row selection lines K. Where data of "1" is to be written in, for example, a memory cell $MC_{22}$, a row selection line $K_2$ is energized and a bit line $L_2$ is energized to a high voltage level $V_{DD}$. As the result, an N channel type FET $TR_{22}$ is rendered conductive to cause a capacitor $C_{S22}$ to be charged up to a high voltage level $V_{DD}$. Where data of "0" is to be written in the memory cell $MC_{22}$, the bit line $L_2$ is energized to a low voltage level $V_{SS}$ (for example, zero volt), thereby enabling a capacitor $C_{D22}$ to be charged up to a high voltage level $V_{DD}$ through the FET $TR_{22}$ rendered operative by the energized row selection line $K_2$.

Data is read out of the memory cell MC by selectively energizing the refresh signal generator 40-1 to 40-n and row selection lines K. Where data of "0" is to be read out of, for example, a memory cell $MC_{22}$, then an IGFET $T_2$ is rendered conductive by an output timing signal from the timing signal generator 10 which has such a waveform as is shown in FIG. 3B. As the result, the bit line $L_2$ is energized up to a high voltage level $V_{DD}$, causing a capacity $C_{02}$ to be also charged up to the high voltage $V_{DD}$. Then, the FET $TR_{22}$ becomes conductive by the energized row selection line $K_2$. Since data of "0" is stored in the memory cell $MC_{22}$, namely the junction of the capacitors $C_{D22}$ and $C_{S22}$ has a low voltage level of $V_{SS}$, the voltage $V_0$ of the bit line $L_2$ after conduction of the FET $TR_{22}$ may be expressed by the following equation:

$$V_0 = \frac{C_{02}}{C_{D22} + C_{S22} + C_{02}} \cdot V_{DD} \tag{1}$$

A change of voltage level from $V_{DD}$ to $V_0$ in the bit line $L_2$ is detected by the data-sensing circuit $SC_2$. A low level signal is sent forth to a data-processing unit (not shown) as data "0". After inverted by the inverter 20-2, the low level signal is supplied to the clocked inverter 30-2 as a high level signal. FET's 31-2, 34-2 included in the clocked inverter 30-2 are rendered conductive by an output refresh signal from a selectively energized refresh signal generator 40-2 which has such a waveform as shown in FIG. 3C. As the result, a FET 33-2 becomes conductive upon receipt of a high level from the inverter 20-2, causing the bit line to be connected to the low level power source $V_{SS}$, and in consequence the junction of the capacitors $C_{D22}$ and $C_{S22}$ to have a low voltage level of $V_{SS}$. Thus, the memory cell $MC_{22}$ is refreshed to store information of "0".

There will now be described the case where information of "1" is to be read out of the memory cell $MC_{22}$. In this case too, the bit line $L_2$ is energized to a high voltage level of $V_{DD}$ by a precharge signal from the timing signal generator 10 to charge the capacitor $C_{02}$ to a high voltage level of $V_{DD}$. Then, the FET $TR_{22}$ is rendered conductive by the selectively energized row selection line $K_2$. Since, at this time, information of "1" is stored in the memory cell $MC_{22}$, namely, the junction of the capacitors $C_{D22}$ and $C_{S22}$ has a high voltage level of $V_{DD}$, the voltage of the bit line $L_2$ is still kept at a high voltage level of $V_{DD}$ even after the FET $TR_{22}$ is rendered conductive. A voltage signal from the bit line $L_2$ is detected by the data-sensing circuit $SC_2$, and a high level signal is sent forth to a data processing unit (not shown) as information of "1". This high level signal is inverted by the inverter 20-2 to be supplied to the clocked inverter 30-2 as a low voltage level signal. Since, as previously described, the FET's 31-2, 34-2 included in the clocked inverter 30-2 are rendered conductive by an output refresh signal from the refresh signal generator 40-2, and the FET 33-2 becomes conductive by an output low voltage level signal from the inverter 20-2, the bit line $L_2$ is connected to the high voltage level power source $V_{DD}$. As the result, the junction of the capacitors $C_{D22}$ and $C_{S22}$ has a high voltage level of $V_{DD}$ and the memory cell $MC_{22}$ is refreshed to store information of "1".

This invention has been described by reference to the foregoing embodiment. However, the invention is not limited thereto but may be applicable in various modifications.

For example, the clocked inverter 30 may be replaced by a clocked inverter 60 of FIG. 4 formed of three P channel FET's 61 to 63. The gates of the FET's 61, 63 are connected to the refresh signal generator 40, and the gate of the FET 62 is connected to the inverter 20. When a high voltage level signal is supplied to the FET 62 from the sensing circuit SC through the inverter 20 when the FET's 61, 63 are rendered conductive by an output from the refresh signal generator 40, then the FET 62 still remains inoperative, causing the bit line L to be impressed with a low level voltage $V_{SS}$. When supplied with a low voltage level signal, then the FET 62 is rendered conductive, causing the bit line L to be impressed with a high level voltage $V_{DD}$.

The foregoing description relates to the case where the memory circuit of FIG. 1 is operated by the positive logic. However, the memory circuit may be so designed as to be operated by the negative logic, with the power source $V_{SS}$ used as a referential voltage source (ground potential) and the power source $V_{DD}$ is a negative power source.

A complementary type semiconductor memory device in which a P conductivity type well is formed in an N conductivity type substrate has been described by reference to FIG. 2. Conversely, however, the semiconductor memory device may have an N conductivity type well formed in a P conductivity type substrate.

Moreover, for clarification, only one memory cell is formed in the semiconductor substrate 100 in FIG. 1, it is possible to form a plurality of memory cells in the semiconductor substrate 100.

What we claim is:

1. A semiconductor memory circuit comprising a plurality of memory cells arranged in one row, each of said memory cells including a semiconductor substrate of one conductivity type, a semiconductor region formed in the surface of the semiconductor substrate with the opposite conductivity type to, and at a higher impurity concentration than, the semiconductor substrate, source and drain regions of said one conductivity type formed in the surface of the semiconductor region and at a higher impurity concentration than the semiconductor substrate, a gate insulation layer formed between the source and drain regions, a gate electrode deposited on the gate insulation layer, an insulation layer formed partly on a selected one of the source and drain regions and an electrically conductive layer deposited on the insulation layer over said selected one of the source and drain regions; a row-energizing line connected in common to the gate electrodes of the memory cells; a plurality of bit lines connected to the selected one of the source and drain regions of each of the memory cells arranged in the same column; a plurality of data-sensing circuits respectively connected to the bit lines; and a plurality of refresh circuits respectively connected to the data-sensing circuits each formed to operate upon receipt of a column selection signal and supply a corresponding one of the bit lines with an output signal corresponding to an output signal of the data-sensing circuit.

2. A semiconductor memory device comprising at least one memory cell including a semiconductor substrate of one conductivity type; a semiconductor region formed in the surface of the semiconductor substrate with the opposite conductivity type to, and at a higher impurity concentration than, the semiconductor substrate; source and drain regions of said one conductivity type formed in the surface of said semiconductor region and having a higher impurity concentration than the semiconductor substrate; a gate insulation layer formed between the source and drain regions; an insulation layer formed partly on a selected one of the source and drain regions; and an electrically conductive layer mounted on said insulation layer over said selected one of the source and drain regions, wherein a first capacitor is formed of the conductive layer and said selected one of the source and drain regions serving as the facing electrodes of the capacitor and a second capacitor is formed in the junction of said semiconductor region and the selected one of the source and drain regions.

3. The semiconductor memory device according to claim 2, wherein an additional region of said one conductivity type is formed in the surface of said semiconductor region in contact with the selected one of the source and drain regions, said additional region being formed shallower than said selected one of the source and drain regions; and said conductive layer is formed to face the additional region and the selected one of the source and drain regions.

4. The semiconductor memory device according to claim 3, wherein the additional region is formed by ion implantation.

5. The semiconductor memory device according to claim 3, wherein said selected one of the source and drain regions has a larger area than the other.

6. A semiconductor memory circuit comprising a plurality of memory cells arranged in at least one column, each of said memory cells including a semiconductor substrate of one conductivity type, a semiconductor region formed in the surface of the semiconductor substrate with the opposite conductivity type to, and at a higher impurity concentration than, the semiconductor substrate, source and drain regions of said one conductivity type formed in the surface of the semiconductor region at a higher impurity concentration than the semiconductor substrate, a gate insulation layer formed between the source and drain regions, a gate electrode deposited on the gate insulation layer, an insulation layer formed partly on a selected one of the source and drain regions, and an electrically conductive layer formed on the insulation layer over said selected one of the source and drain regions; a plurality of row-energizing lines each connected to the gate electrode of the memory cell arranged in the same row; at least one bit line connected to the other of the source and drain regions of each of the memory cells arranged in the same column; at least one data-sensing circuit connected to the bit line and at least one refresh circuit connected to operate upon receipt of a column selection signal and connected to the bit line to supply a corresponding bit line with an output signal corresponding to an output signal of the data-sensing circuit.

7. A semiconductor memory circuit according to claim 6, wherein an additional region of said one conductivity type is formed in the surface of said semiconductor region in contact with the selected one of the source and drain regions, said additional region being formed shallower than said selected one of the source and drain regions, and said conductive layer is formed to face the additional region and the selected one of the source and drain regions.

8. The semiconductor memory circuit according to claim 6, wherein the refresh circuit comprises an inverter for inverting an output signal from the data-sensing circuit; a refresh signal generator for sending forth a refresh signal in response to a column selection signal; and a clocked inverter formed to operate upon receipt of an output refresh signal from the refresh signal generator, invert an output from the inverter and supply the inverted signal to the bit line.

9. The semiconductor memory circuit according to claim 8, wherein the clocked inverter is provided with first and second power supply terminals, an output terminal connected to the bit line, first and second IGFET's of a first channel type connected in series between the first power supply terminal and output terminal, third and fourth IGFET's of a second channel type different from the first channel type which are connected in series between the second power supply terminal and output terminal, and also wherein the first and fourth IGFET's are rendered conductive by an output refresh signal from the refresh signal generator and the second and third IGFET's are selectively rendered conductive according to the voltage level of an output signal from the sensing circuit.

10. The semiconductor memory circuit according to claim 8, wherein the clocked inverter is provided with first and second power supply terminals, an output terminal connected to the bit line, a first IGFET of a first channel type connected between the first power supply terminal and output terminal, second and third IGFET's of the first channel type connected in series between the second power supply terminal and output terminal, and also wherein the first and third IGFET's are rendered conductive upon receipt of an output refresh signal from the refresh signal generator, and the second IGFET becomes conductive according to the voltage level of an output from the data-sensing circuit.

* * * * *